(12) United States Patent
Kim et al.

(10) Patent No.: US 12,637,763 B2
(45) Date of Patent: May 26, 2026

(54) METHOD FOR FORMING SiCN THIN FILM

(71) Applicant: ISTE, Hwaseong-si (KR)

(72) Inventors: Geun-Ho Kim, Yongin-si (KR);
Jong-Sin Hyun, Hwaseong-si (KR);
Won-Jung Kim, Pyeongtaek-si (KR);
Dong-Hyeok Choi, Suwon-si (KR);
Gwang-Won Seo, Osan-si (KR)

(73) Assignee: ISTE, Hwaseong-si (KR)

( * ) Notice: Subject to any disclaimer, the term of this patent is extended or adjusted under 35 U.S.C. 154(b) by 147 days.

(21) Appl. No.: 18/706,045

(22) PCT Filed: Dec. 9, 2021

(86) PCT No.: PCT/KR2021/018669
§ 371 (c)(1),
(2) Date: Apr. 30, 2024

(87) PCT Pub. No.: WO2023/095999
PCT Pub. Date: Jun. 1, 2023

(65) Prior Publication Data
US 2025/0003060 A1      Jan. 2, 2025

(30) Foreign Application Priority Data

Nov. 24, 2021     (KR) ........................ 10-2021-0163058

(51) Int. Cl.
*C23C 16/36*          (2006.01)
*C23C 16/46*          (2006.01)
(Continued)

(52) U.S. Cl.
CPC .............. *C23C 16/36* (2013.01); *C23C 16/46* (2013.01); *C23C 16/505* (2013.01); *C23C 16/52* (2013.01)

(58) Field of Classification Search
CPC ....... C23C 16/36; C23C 16/46; C23C 16/505; C23C 16/52
See application file for complete search history.

(56) References Cited

U.S. PATENT DOCUMENTS

2012/0058282 A1*   3/2012   Hong .................. C23C 16/5096
                                                      427/579

FOREIGN PATENT DOCUMENTS

JP        2003179054 A      6/2003
JP        2005530924 A      10/2005
(Continued)

OTHER PUBLICATIONS

International Search Report—PCT/KR2021/018669 dated Jul. 19, 2022.

*Primary Examiner* — Kelly M Gambetta
(74) *Attorney, Agent, or Firm* — CANTOR COLBURN LLP

(57)          ABSTRACT

Provided is a method for forming a SiCN thin film. The method includes the steps of: loading a target wafer onto a chuck heater located inside a chamber; operating the chuck heater to allow the target wafer to be heated to a target deposition temperature in the range of 200 to 550° C.; setting a target process pressure in the chamber to 2.0 to 10.0 Torr; and injecting a gas for plasma excitation and first and second reaction gases for forming the SiCN thin film into the chamber set to the target deposition temperature and the target process pressure to allow the SiCN thin film to have a refractive index in the range of 1.80 to 2.40.

2 Claims, 13 Drawing Sheets

(51) Int. Cl.
  _C23C 16/505_  (2006.01)
  _C23C 16/52_  (2006.01)

(56)  References Cited

FOREIGN PATENT DOCUMENTS

| JP | 2006269580 | A | * | 10/2006 |
| KR | 20070102764 | A | | 10/2007 |
| KR | 20120024473 | A | | 3/2012 |

* cited by examiner

| Item | Temperature °C | Pressure Torr | RF Watt | Gas Flow 4MS | NH3 | He | N2 | 4MS/NH3 Ratio | SiCN Thin film RI | SiCN thickness measured through Ellipsometer before HAST | after HAST | Thickness growth rate |
|---|---|---|---|---|---|---|---|---|---|---|---|---|
| #1 | 350 | 4.2 | 650 | 200 | 1860 | 1550 | 250 | 19.3 | 1.834 | 692 | 695 | 0.4% |
| #2 | 350 | 4.2 | 650 | 200 | 1860 | 0 | 0 | 19.3 | 1.683 | 708 | 847 | 19.6% |
| #3 | 350 | 4.2 | 650 | 200 | 1860 | 0 | 250 | 19.3 | 1.736 | 702 | 690 | 0% |
| #4 | 350 | 4.2 | 650 | 560 | 2047 | 1550 | 250 | 13.65 | 1.776 | 802 | 882 | 10.0% |
| #5 | 350 | 4.2 | 650 | 560 | 2047 | 1950 | 500 | 13.65 | 1.785 | 718 | 800 | 10.0% |
| #6 | 350 | 4.2 | 650 | 200 | 2400 | 1550 | 250 | 1.12 | 1.828 | 691 | 693 | 0.3% |
| #7 | 350 | 4.2 | 650 | 200 | 1200 | 1550 | 250 | 16.0 | 1.849 | 705 | 707 | 0.3% |
| #8 | 350 | 4.2 | 650 | 200 | 1800 | 1550 | 250 | 19.0 | 1.835 | 693 | 695 | 0.3% |
| #9 | 350 | 4.2 | 650 | 200 | 1920 | 1550 | 250 | 19.6 | 1.833 | 705 | 702 | 0% |
| #10 | 350 | 2.0 | 650 | 200 | 1860 | 0 | 0 | 19.3 | 1.857 | 692 | 685 | 0% |
| #11 | 350 | 10.0 | 650 | 200 | 1860 | 1550 | 250 | 19.3 | 1.590 | 694 | 752 | 8.4% |
| #12 | 350 | 4.2 | 150 | 200 | 1860 | 1550 | 250 | 19.3 | 1.697 | 677 | 797 | 17.7% |
| #13 | 200 | 4.2 | 650 | 200 | 1860 | 1550 | 250 | 19.3 | 1.653 | 727 | 801 | 10.2% |
| #14 | 350 | 4.2 | 650 | 200 | 1860 | 1800 | 0 | 19.3 | 1.809 | 702 | 696 | 0% |
| #15 | 350 | 4.2 | 650 | 200 | 1860 | 0 | 1800 | 19.3 | 1.823 | 697 | 691 | 0% |
| #16 | 400 | 4.2 | 650 | 200 | 1860 | 1550 | 250 | 19.3 | 1.917 | 700 | 694 | -1% |
| #17 | 400 | 4.2 | 650 | 200 | 1860 | 0 | 0 | 19.3 | 1.749 | 691 | 878 | 27% |
| #18 | 350 | 4.2 | 1200 | 200 | 1860 | 1550 | 250 | 19.3 | 1.901 | 685 | 665 | -3% |
| #19 | 350 | 4.2 | 1200 | 200 | 1860 | 0 | 0 | 19.3 | 1.763 | 720 | 913 | 27% |
| #20 | 550 | 4.2 | 650 | 200 | 1860 | 1550 | 250 | 19.3 | 2.031 | 686 | 675 | 2% |
| #21 | 550 | 4.2 | 650 | 200 | 1860 | 0 | 0 | 19.3 | 1.920 | 712 | 699 | 2% |

4 802Å before Bake          #5 718Å before Bake

4 882Å before Bake          #5 800Å before Bake

685Å before Bake
1.901

720Å before Bake
1.763

665Å after Bake

913Å after Bake

METHOD FOR FORMING SiCN THIN FILM

TECHNICAL FIELD

The present invention relates to a method for forming a SiCN thin film, more specifically to a method for forming a SiCN thin film wherein the SiCN thin film is formed under film formation conditions wherein the refractive index of the SiCN thin film is greater than or equal to a specific refractive index, so that the deterioration of the SiCN thin film due to adsorption of moisture or oxygen after the SiCN thin film have been formed can be alleviated to improve the reliability of a device.

BACKGROUND ART

As a wiring structure of a semiconductor device has been multilayered, recently, high conformality on a high-aspect-ratio structure is needed.

Therefore, as shown in FIG. 1, in the case of a non-memory device such as a logic device wherein a plurality of metal layers are overlaid on top of one another, unlike a memory device, copper having low resistance and excellent migration properties is generally used. As a result, a conventional PE-SIN thin film as a low-k etch stopping film has been replaced with a PE-SiCN (silicon carbon nitride) thin film having excellent properties of copper barrier film and etch stopping.

Further, as downsizing of devices has been accelerated in memory semiconductor fields, a metal layer has been changed from a conventional aluminum layer to a copper layer, so that a PE-CVD SiCN thin film is increasingly adopted.

That is, as the copper layer as the metal layer is adopted, wiring resistance becomes low, but copper has a high diffusion coefficient, so that the diffusion of copper has a serious bad influence on device characteristics. Therefore, the reason why the PE-CVD SiCN thin film is increasingly adopted is because it is more important to have copper diffusion prevention performance.

That is, as a dielectric constant of a SiCN thin film is 4.9 to 5.2, which is lower than the dielectric constant of 7.0 to 8.0 of a SiN thin film, the SiCN thin film is more advantageous than the SiN thin film in terms of RC delay, obtains excellent diffusion prevention effects of Cu, O, and H, and has excellent etch selectivity, so that the SiCN thin film is adequate in preventing the diffusion of copper.

In the case of a SiCN thin film adopted in an ultra-high density 14 nm DRAM or NAND flash, recently, the deterioration of the SiCN thin film occurs due to adsorption of moisture or oxygen after the SiCN thin film has been formed, thereby seriously lowering the reliability of a device.

Therefore, there is a consistent need to develop a method for forming a SiCN thin film under new conditions wherein the properties of the SiCN thin film are prevented from being deteriorated due to adsorption of moisture or oxygen.

[National research and development project for supporting this invention]
[Subject No.] 1711139190 (on 2021)
[Subject management (professional) organization name] National NanoFab Center
[Research subject name] Development of PECVD system having etch selectivity of SiCN thin film 20% more than that of a conventional system etch selectivity and improvements of adhesion and deposition rate onto Cu
[Contribution rate] ½

[Subject lead organization] National NanoFab Center
[Research period] Jan. 1, 2021 to Dec. 31, 2022 (for 24 months)
[Subject No.] 1425154175
[Subject management (professional) organization name] Korea technology & information promotion agency for SMEs
[Research subject name] Development of dual type 300 mm PECVD system for deposition of SiCN thin film
[Contribution rate] ½
[Subject lead organization] ISTE Co., Ltd.
[Research period] Jun. 1, 2021 to May 31, 2025 (for 48 months)

DISCLOSURE OF THE INVENTION

Technical Problems

Accordingly, it is an object of the present invention to provide a method for forming a SiCN thin film wherein the SiCN thin film is formed under film formation conditions wherein the SiCN thin film is formed under film formation conditions wherein the refractive index of the SiCN thin film is greater than or equal to a specific refractive index, so that the deterioration of the SiCN thin film due to adsorption of moisture or oxygen after the SiCN thin film have been formed can be alleviated to improve the reliability of a device.

The technical problems to be achieved through the present invention are not limited as mentioned above, and other technical problems not mentioned herein will be obviously understood by one of ordinary skill in the art through the following description. Further, objects, characteristics and advantages of the present invention will be more clearly understood from the detailed description as will be described below and the attached drawings.

Technical Solutions

To accomplish the above-mentioned objects, according to one aspect of the present invention, there is provided a method for forming a SiCN thin film including the steps of: loading a target wafer onto a chuck heater located inside a chamber; operating the chuck heater to allow the target wafer to be heated to a target deposition temperature in the range of 200 to 550° C.; setting a target process pressure in the chamber to 2.0 to 10.0 Torr; and injecting a gas for plasma excitation and first and second reaction gases for forming the SiCN thin film into the chamber set to the target deposition temperature and the target process pressure to allow the SiCN thin film to have a refractive index in the range of 1.80 to 2.40.

Further, the gas for plasma excitation may include at least one or more gases selected from the group consisting of He, Ne, Ar, Xe, Kr, and N2 and be injected into the chamber at the flow rate of 300 to 3000 sccm, the first reaction gas may be either trimethylsilane (3MS) or tetramethylsilane (4MS), and the second reaction gas may be $NH_3$, a distribution ratio of the first reaction gas to the second reaction gas in the chamber being set to 1:1.2 to 1:4.

Furthermore, the flow rate of the gas for plasma excitation may be inversely proportional to the flow rate of the second reaction gas.

Besides, the chamber may have RF power set to 150 to 800 Watt applied thereto.

Further, if the target deposition temperature is set to a temperature in the range of 200 to 350° C., the targe process pressure may be set to 2.0 to 4.5 Torr, the flow rate of the gas for plasma excitation may be set to 1000 to 3000 sccm, and the RF power may be set to 650 to 1500 Watt.

Furthermore, if the target process pressure is set to pressure in the range of 4.5 to 10.0 Torr, the target deposition temperature may be set to 350 to 550° C., the flow rate of the gas for plasma excitation may be set to 1000 to 3000 sccm, and the RF power may be set to 650 to 1500 Watt.

To accomplish the above-mentioned objects, according to another aspect of the present invention, there is provided a method for forming a SiCN thin film, including the steps of: loading a target wafer onto a chuck heater located inside a chamber; forming a first SiCN thin film having a first thickness in such a way as to have the refractive index less than 1.80; and forming a second SiCN thin film having a second thickness on top of the first SiCN thin film in such a way as to have the refractive index greater than or equal to 1.80, wherein a ratio of the first thickness to the second thickness is set to 1:1 to 1:2.

Further, the step of forming the second SiCN thin film may include the steps of operating the chuck heater to allow the target wafer on which the first SiCN thin film is formed to be heated to a target deposition temperature in the range of 200 to 550° C.; setting a target process pressure in the chamber to 2.0 to 10.0 Torr; and injecting a gas for plasma excitation and first and second reaction gases for forming the SiCN thin film into the chamber set to the target deposition temperature and the target process pressure to allow the second SiCN thin film to have a refractive index in the range of 1.80 to 2.40.

Further, the gas for plasma excitation may include at least one or more gases selected from the group consisting of He, Ne, Ar, Xe, Kr, and N2 and be injected into the chamber at the flow rate of 300 to 3000 sccm, the first reaction gas may be either 3MS or 4MS, and the second reaction gas may be $NH_3$, a distribution ratio of the first reaction gas to the second reaction gas in the chamber being set to 1:1.2 to 1:4.

Furthermore, the flow rate of the gas for plasma excitation may be inversely proportional to the flow rate of the second reaction gas.

Besides, the chamber may have RF power set to 150 to 800 Watt applied thereto.

Further, if the target deposition temperature is set to a temperature in the range of 200 to 350° C., the targe process pressure may be set to 2.0 to 4.5 Torr, the flow rate of the gas for plasma excitation may be set to 1000 to 3000 sccm, and the RF power may be set to 650 to 1500 Watt.

Furthermore, if the target process pressure is set to pressure in the range of 4.5 to 10.0 Torr, the target deposition temperature may be set to 350 to 550° C., the flow rate of the gas for plasma excitation may be set to 1000 to 3000 sccm, and the RF power may be set to 650 to 1500 Watt.

Advantageous Effects of the Invention

According to the present invention, the SiCN thin film is formed under film formation conditions wherein the SiCN thin film is formed under film formation conditions wherein the refractive index of the SiCN thin film is greater than or equal to a specific refractive index, so that the deterioration of the SiCN thin film due to adsorption of moisture or oxygen after the SiCN thin film have been formed can be alleviated to improve the reliability of a device.

Specific effectiveness of the present invention as well as the above-mentioned effectiveness will be explained through the following description.

BRIEF DESCRIPTION OF DRAWINGS

FIG. 5 is a table showing refractive indexes determined according to various film formation conditions and deterioration characteristics of SiCN thin films due to refractive indexes.

FIGS. 6 to 13 show XPS graphs of SiCN thin films having different refractive indexes according to embodiments the present invention.

BEST MODE FOR INVENTION

Hereinafter, the operating principle of the present invention will be described in detail with reference to the attached drawings. If it is determined that the detailed explanation on the well-known technology related to the present invention makes the scope of the present invention not clear, the explanation will be avoided for the brevity of the description. Further, the terms as will be discussed later are defined in accordance with the functions of the present invention, but may be varied under the intention or regulation of a user or operator. Therefore, they should be defined on the basis of the whole scope of the present invention.

Figure 1:
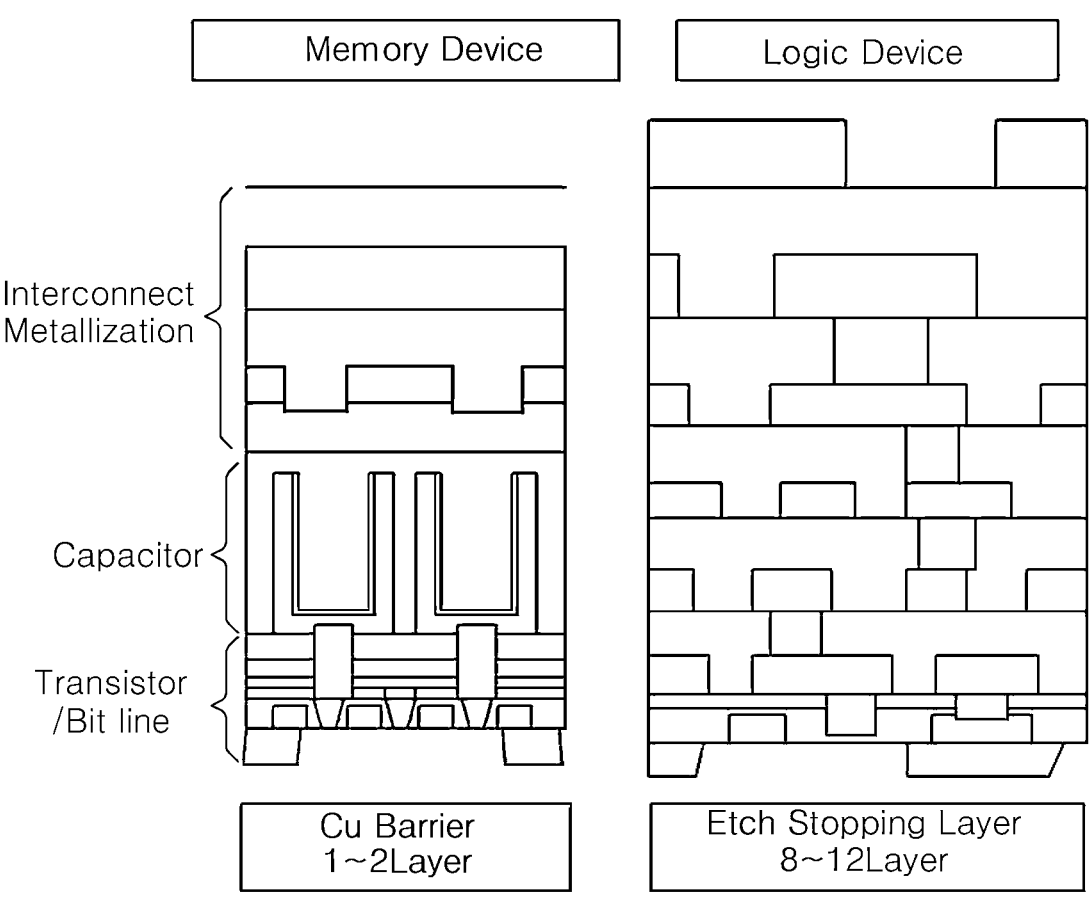
FIG. 1 shows cross-sectional layers of conventional memory and non-memory devices.
Figure 2:
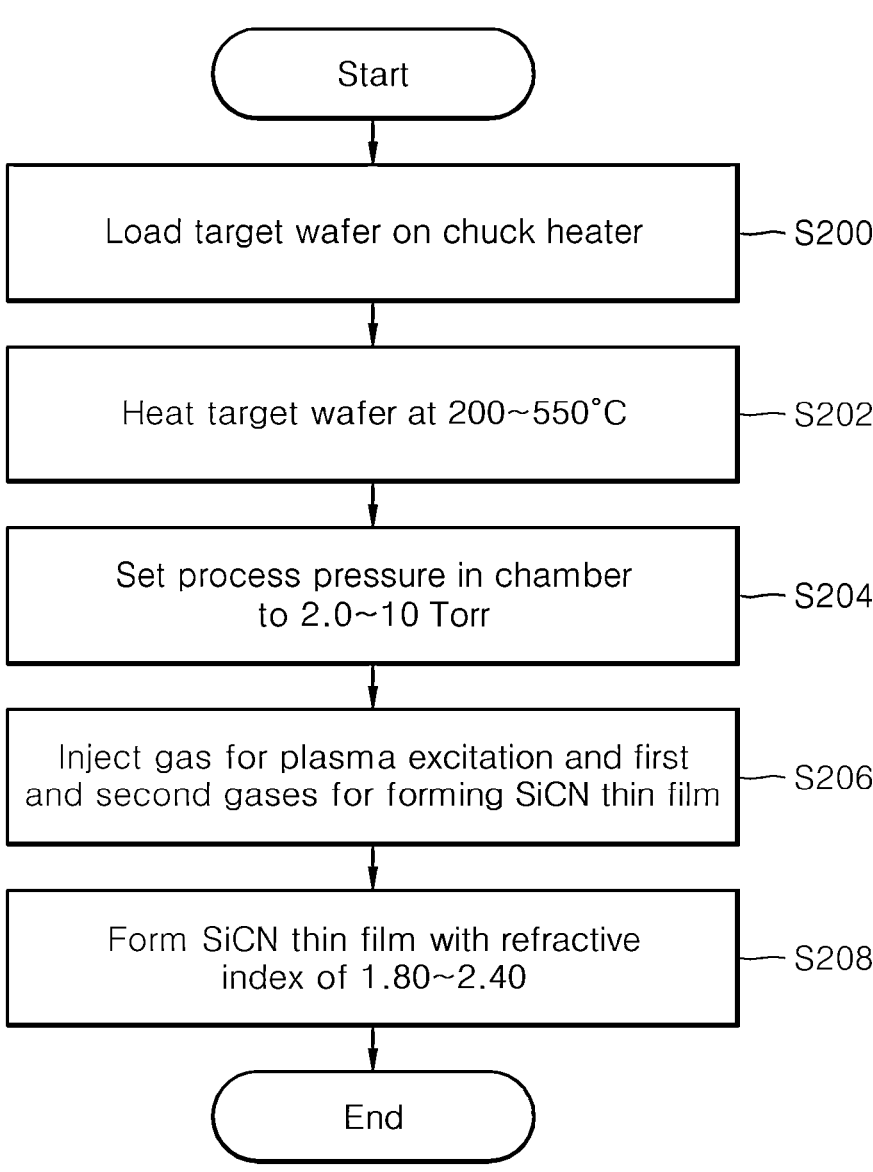
FIG. 2 is a flowchart showing a method for forming a SiCN thin film according to an embodiment of the present invention.

FIG. 2 is a flowchart showing a method for forming a SiCN thin film according to an embodiment of the present invention.

Figure 3:
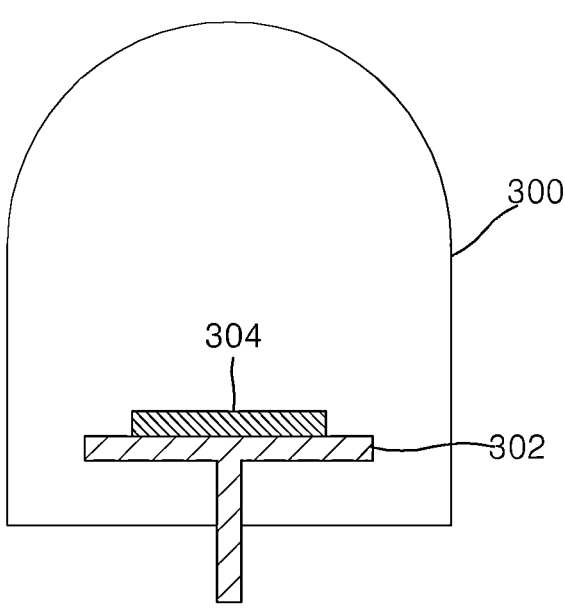
FIG. 3 is a schematic sectional view showing a chamber in which the SiCN thin film is formed according to the embodiment of the present invention.

FIG. 3 is a schematic sectional view showing a chamber in which the SiCN thin film is formed according to the embodiment of the present invention.

First, as shown in FIG. 2, a target wafer 304 as an object for SiCN thin film deposition is loaded onto a chuck heater 302 located inside a vacuum chamber 300 for deposition at step S200. The target wafer has a Cu layer or silicon oxide film formed on top thereof.

Next, the chuck heater operates to allow the target wafer to be heated to a target deposition temperature in the range of 200 to 550° C. at step S202, and a target process pressure in the chamber is set to 2.0 to 10.0 Torr at step S204.

After that, a gas for plasma excitation and first and second reaction gases for forming a SiCN thin film are injected into the chamber at step S206.

Next, RF power is applied to an electrode part in the chamber to allow the first reaction gas and the second reaction gas to be ionized by means of the gas for plasma excitation, and the ionized gases are deposited on top of the silicon oxide film to form the SiCN thin film at step S208.

In this case, if the SiCN thin film with a refractive index less than 1.80 is formed, as mentioned above, the properties of the SiCN thin film may be deteriorated due to adsorption of moisture or oxygen after the SiCN thin film has been formed, thereby seriously lowering the reliability of a device.

According to the embodiment of the present invention, therefore, a flow rate of gas for plasma excitation and a distribution ratio of the first reaction gas to the second reaction are determined to allow the refractive index of the SiCN thin film to be in the range of 1.80 to 2.40, so that the SiCN thin film with the refractive index of 1.80 to 2.40 is formed at step S208.

In this case, for example, the gas for plasma excitation includes at least one or more gases selected from the group consisting of He, Ne, Ar, Xe, Kr, and N2 and is injected into the chamber at the flow rate of 300 to 3000 sccm.

Further, for example, the first reaction gas is either 3MS or 4MS, and the second reaction gas is $NH_3$. The selected gases are injected into the chamber.

In this case, a distribution ratio of the first reaction gas to the second reaction gas in the chamber is desirably 1:1.2 to 1:4, but it may not be limited necessarily thereto.

Further, the RF power is set to 150 to 1500 Watt.

Furthermore, the flow rate of the second reaction gas is set inversely proportional to the flow rate of the gas for plasma excitation. That is, for example, if the flow rate of the second reaction gas is decreased, the flow rate of the gas for plasma excitation is increased, and contrarily, if the flow rate of the second reaction gas is increased, the flow rate of the gas for plasma excitation is decreased.

Like this, the target deposition temperature, the targe process pressure, and the target RF power for the target wafer are set, and the flow rate of the gas for plasma excitation and the ratio of the first reaction gas to the second reaction gas are controlled, so that the SiCN thin film having the refractive index of 1.80 to 2.40 is formed. Therefore, the properties of the SiCN thin film may not be deteriorated due to adsorption of moisture or oxygen onto the SiCN thin film after the SiCN thin film has been formed.

According to another embodiment of the present invention, further, in the case where the target deposition temperature has to be lower than the temperature in the range of 200 to 550° C., the targe process pressure is lowered, the flow rate of the gas for plasma excitation is increased, and the RF power is increased, so that the SiCN thin film having the refractive index greater than or equal to 1.80 is formed.

For example, if the target deposition temperature is set lowered to a temperature in the range of 200 to 350° C. from the temperature in the range of 200 to 550° C., desirably, the targe process pressure is set to 2.0 to 4.5 Torr, the flow rate of the gas for plasma excitation is set to 1000 to 3000 sccm, and the RF power is set to 650 to 1500 Watt.

According to yet another embodiment of the present invention, further, in the case where the target process pressure has to be higher than the pressure in the range of 2.0 to 10.0 Torr, the targe deposition temperature is increased, the flow rate of the gas for plasma excitation is increased, and the RF power is increased, so that the SiCN thin film having the refractive index greater than or equal to 1.80 is formed.

For example, if the target process pressure has to be increased to pressure in the range of 4.5 to 10.0 Torr from the pressure in the range of 2 to 10 Torr, desirably, the target deposition temperature is set to 350 to 550° C., the flow rate of the gas for plasma excitation is set to 1000 to 3000 sccm, and the RF power is set to 650 to 1500 Watt.

Figure 4:
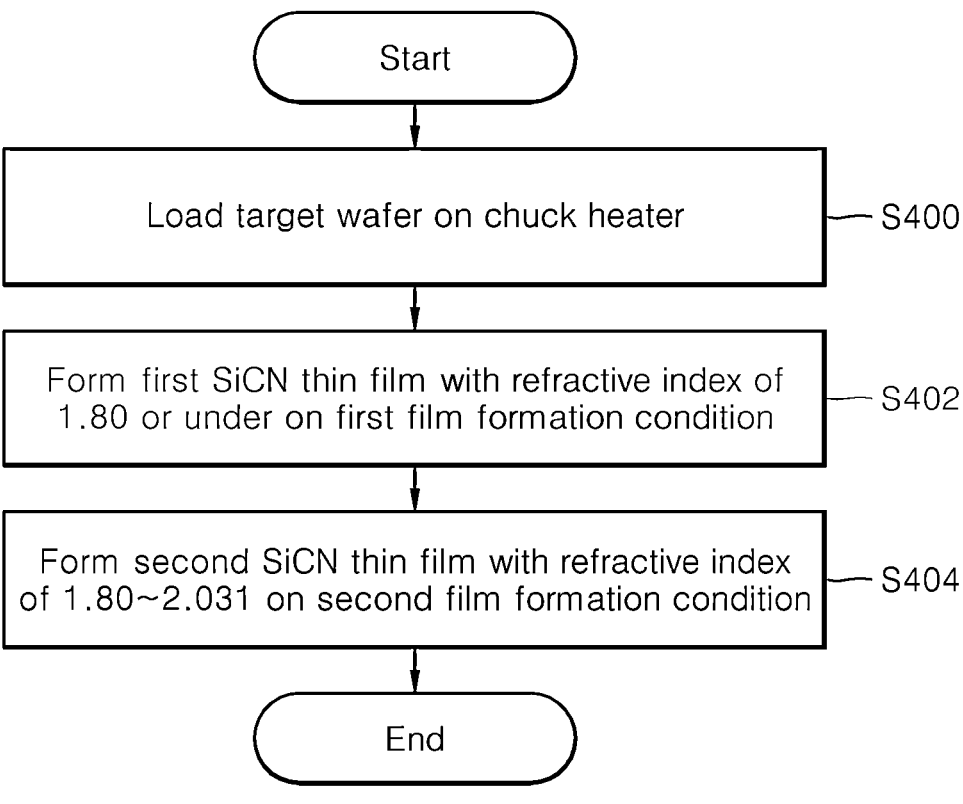
FIG. 4 is a flowchart showing a method for forming SiCN thin films having different refractive indexes according to another embodiment of the present invention.

FIG. 4 is a flowchart showing a method for forming SiCN thin films having different refractive indexes according to another embodiment of the present invention.

First, as shown in FIG. 4, a target wafer as an object for SiCN thin film deposition is loaded onto a chuck heater located inside a vacuum chamber 300 for deposition at step S400. The target wafer has a silicon oxide film formed on top thereof.

Next, a first SiCN thin film with a first thickness is formed on the target wafer in such a way as to have the refractive index less than 1.80 under a first film formation condition at step S402. In this case, the first film formation condition represents one of general film formation conditions used in forming the existing SiCN thin film, irrespective of refractive indexes, and the present invention may not be limited thereto.

Next, a second SiCN thin film with a second thickness is formed on the target wafer on which the first SiCN thin film is formed in such a way as to have the refractive index in the range of 1.80 to 2.40 under a second film formation condition according to an embodiment of the present invention at step S404. In this case, a ratio of the first thickness to the second thickness is desirably 1:1 to 1:2, and for example, the second thickness of the second SiCN thin film is in the range of 10 to 12 nm. However, the present invention may not be limited thereto.

Hereinafter, an explanation of the process for forming the second SiCN thin film according to the embodiment of the present invention will be given in detail, and as mentioned above, first, the chuck heater operates to allow the target wafer on which the first SiCN thin film is formed to be heated to a target deposition temperature in the range of 200 to 550° C., and a target process pressure in the chamber is set to 2 to 10 Torr.

After that, a gas for plasma excitation and first and second reaction gases for forming a SiCN thin film are injected into the chamber.

Next, RF power is applied to an electrode part in the chamber to allow the first reaction gas and the second reaction gas to be ionized by means of the gas for plasma excitation, and the ionized gases are deposited on top of the silicon oxide film to form the second SiCN thin film.

In this case, for example, the gas for plasma excitation includes at least one or more gases selected from the group consisting of He, Ne, Ar, Xe, Kr, and N2 and is injected into the chamber at the flow rate of 300 to 3000 sccm.

Further, for example, the first reaction gas is either 3MS or 4MS, and the second reaction gas is $NH_3$. The selected gases are injected into the chamber.

In this case, a distribution ratio of the first reaction gas to the second reaction gas in the chamber is desirably 1:1.2 to 1:4, but it may not be limited necessarily thereto.

Further, the RF power is set to 150 to 800 Watt.

Furthermore, the flow rate of the second reaction gas is set inversely proportional to the flow rate of the gas for plasma excitation. That is, for example, if the flow rate of the second reaction gas is decreased, the flow rate of the gas for plasma excitation is increased, and contrarily, if the flow rate of the second reaction gas is increased, the flow rate of the gas for plasma excitation is decreased.

Like this, the target deposition temperature, the targe process pressure, and the target RF power for the target wafer on which the first SiCN thin film is formed are set, and the flow rate of the gas for plasma excitation and the ratio of the first reaction gas to the second reaction gas are controlled, so that the second SiCN thin film having the refractive index of 1.80 to 2.40 is formed as a capping layer, and accordingly, the properties of the SiCN thin film are not deteriorated due to adsorption of moisture or oxygen adsorption onto the SiCN thin film after the SiCN thin film has been formed.

Further, if the SiCN thin film has the refractive index less than 1.80, the deterioration of the thin film is found through tests.

FIG. 5 is a table showing refractive indexes determined according to various film formation conditions and deterioration characteristics of SiCN thin films due to refractive indexes.

In this case, as shown in FIG. 5, SiCN thin films having different refractive indexes are formed under various process conditions, and while the SiCN thin films are being exposed under HAST conditions, after that, they become deteriorated in properties due to moisture or oxygen in the air. In this case, it is assumed that the HAST conditions consist of 110° C. temperature and 85% RH humidity, 122 kPa pressure, and 96 hours exposure time.

Referring to FIG. 5, it is found that the SiCN thin films having the refractive index less than 1.8, as denoted with reference numerals 510, are oxidized after treated under the HAST conditions, so that they are increased in thickness.

FIGS. 6 to 13 show X-ray Photoelectron Spectroscopy (XPS) graphs of SiCN thin films having different refractive indexes according to embodiments of the present invention.

Figure 6:
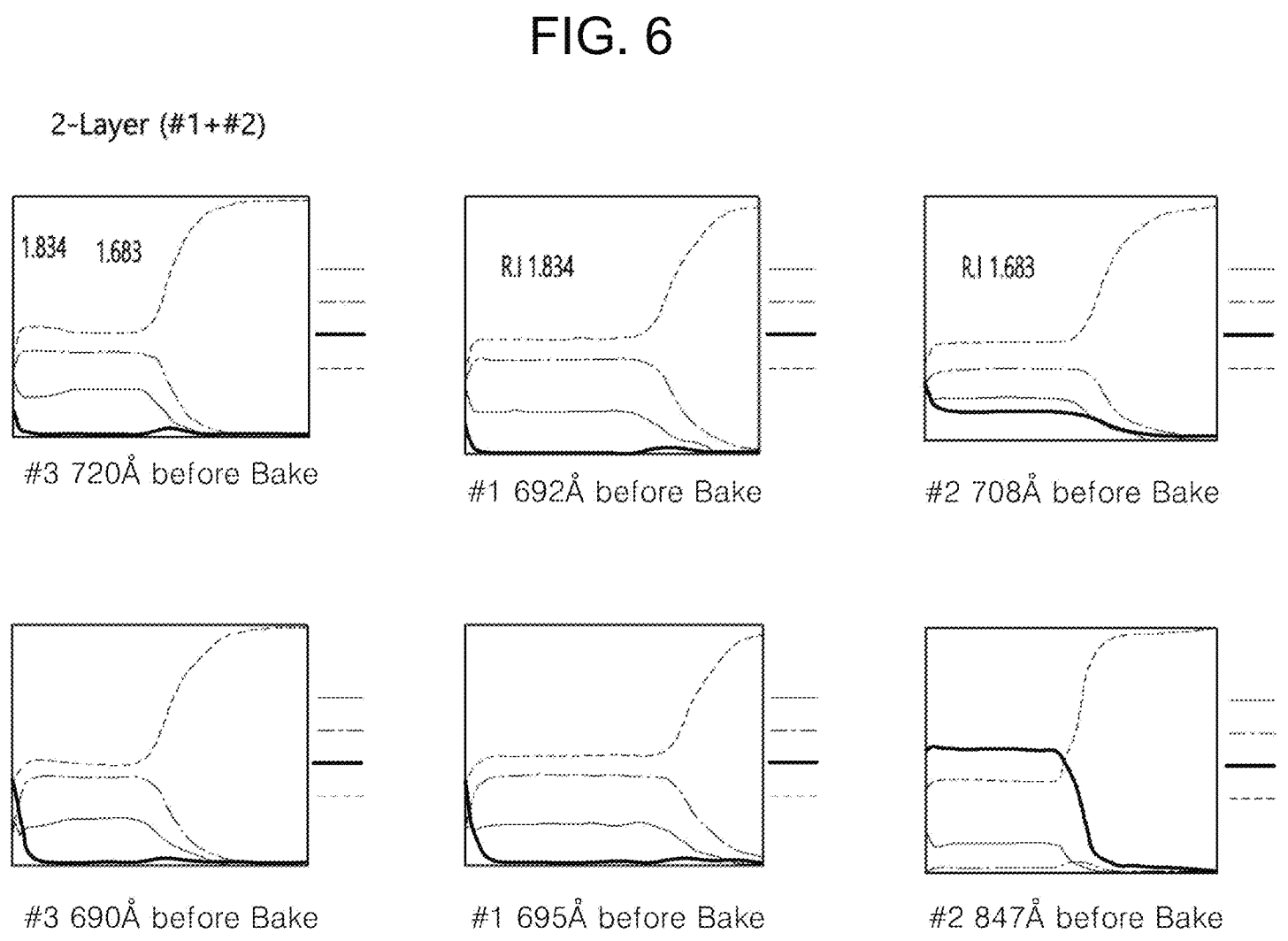

Referring first to FIG. 6 showing the states of samples (SiCN thin films) #1, #2, and #3 before and after the application of the HAST conditions, it is appreciated that the introduction of oxygen into the SiCN thin films does not occur in the process where the SiCN thin films are formed in the vacuum chamber.

Further, even if the sample #1 is exposed to the atmosphere, the introduction of oxygen thereinto does not occur, and in the case of the sample #2, a large amount of oxygen is introduced in as-deposited state thereof, and after the sample #2 is exposed to the atmosphere, the oxygen is introduced into the SiCN thin film.

That is, the sample #1 does not have any change in oxygen content even after the application of the HAST conditions and does not have any change in thickness before and after the application of the HAST conditions, but the sample #2 has the oxygen content increasing explosively and is greatly increased in thickness.

Further, it is checked that such a difference between the sample #1 and the sample #2 is due to a refractive index (R.I) difference between the SiCN thin films formed.

In this case, if a refractive index of 1.80 is determined as a reference refractive index, the refractive index lower than the reference refractive index means the density of the thin film is relatively low, and in this case, the low density of the thin film is due to the introduction of oxygen. Further, such a difference in the as-deposited state becomes obvious after the application of the HAST conditions, as shown in FIG. 5.

That is, if the refractive index is lower than 1.80, the density of the thin film formed is low, and oxygen in the atmosphere is absorbed and introduced into the thin film. In this state, if the SiCN thin film is exposed to a high humidity environment, the thin film itself is oxidized and swollen, thereby causing the thin film characteristics to be rapidly deteriorated.

Figure 7:
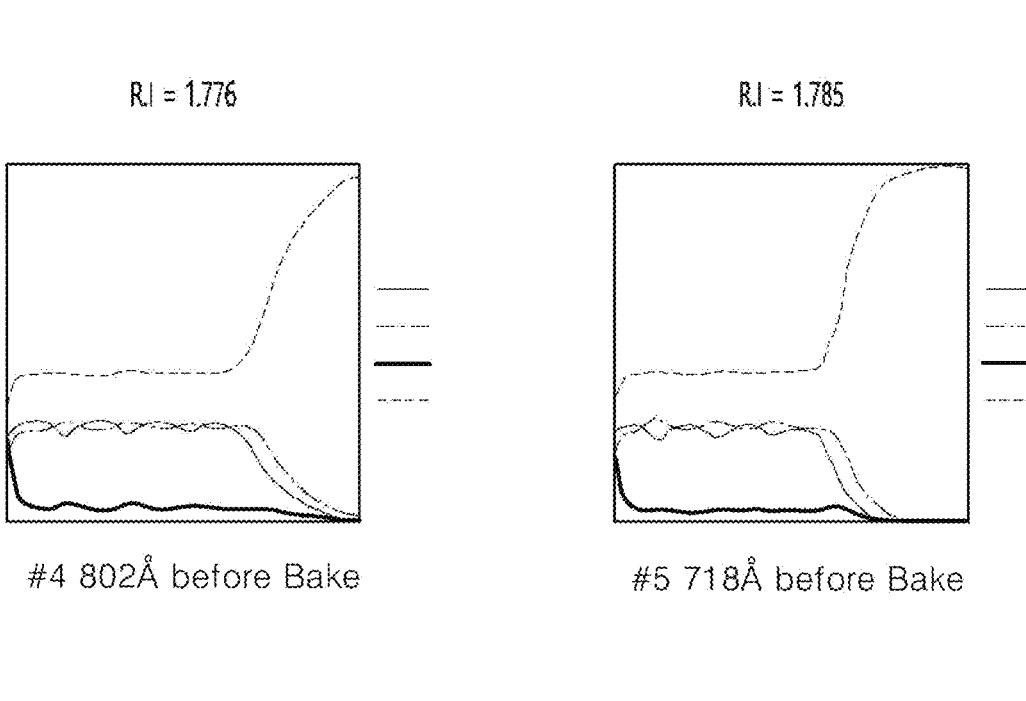
Figure 7:
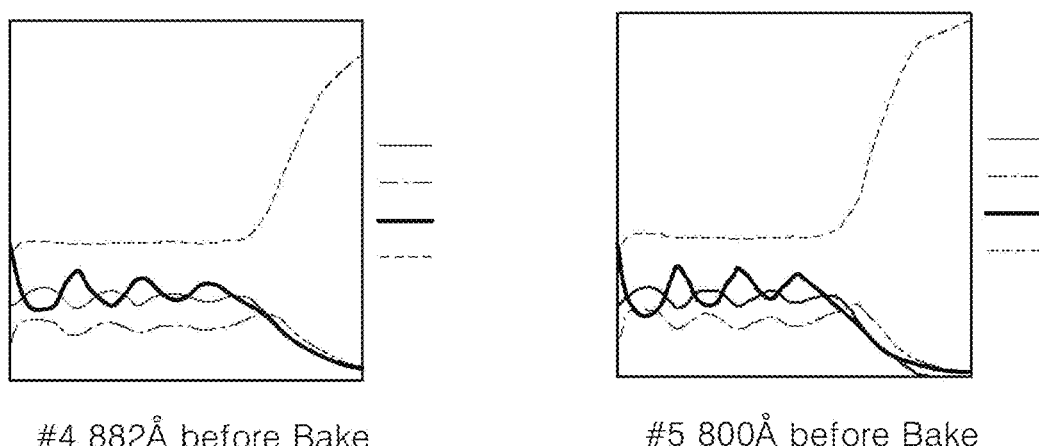

Referring next to FIG. 7, in the case of samples (SiCN thin films) #4 and #5, a ratio of TMS to $NH_3$ is set to 1:3.65, and unlike the sample #1 having the ratio of TMS to $NH_3$ of 1:9.3, their TMS rate is increased to cause the refractive indexes to be less than 1.80.

In this case, it is found that oxygen content in the thin films in the as-deposited state is larger than that in the sample #1. Further, the samples #4 and #5 are greatly varied in thickness before and after the application of the HAST conditions and have drastically increasing oxygen content after the application of the HAST conditions.

That is, the reason why the refractive indexes are low in the samples #4 and #5 is different from that in the sample #2, but while they are exposed to a high humidity environment, like the sample #2, the thin films themselves are oxidized and swollen, thereby causing the thin film characteristics to be rapidly deteriorated.

Figure 8:
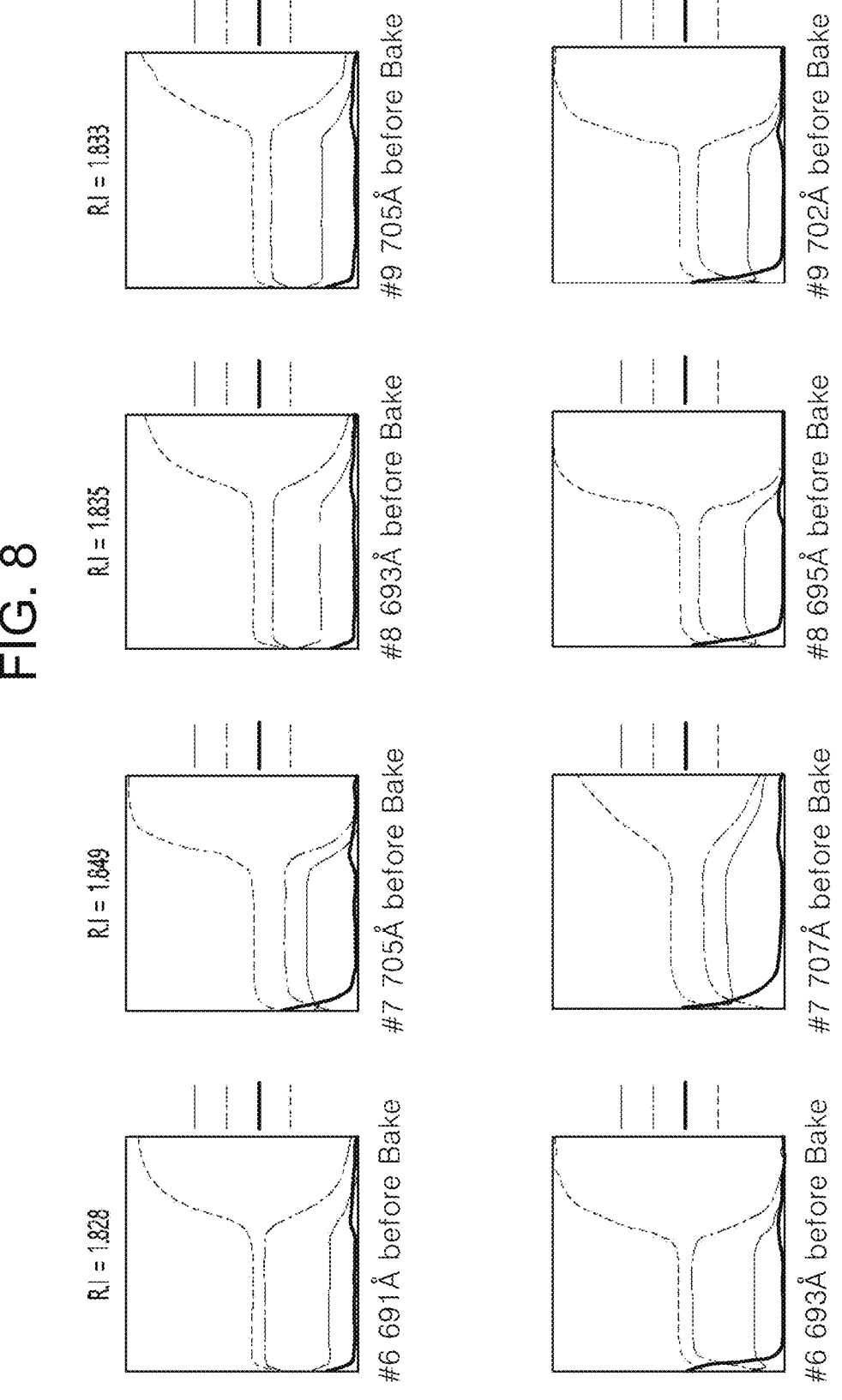

Referring next to FIG. 8, samples (SiCN thin films) #6, #7, #8, and #9 have different ratios of TMS to $NH_3$ of 1:12 to 1:6, but their refractive indexes are greater than or equal to 1.80.

In this case, it is found that oxygen content in the thin films in the as-deposited states is less than or equal to 1.5%, so that even after the application of the HAST conditions, the thin films are not oxidized, while still keeping low oxygen content, and they have rare changes in thickness before and after the application of the HAST conditions.

Figure 9:
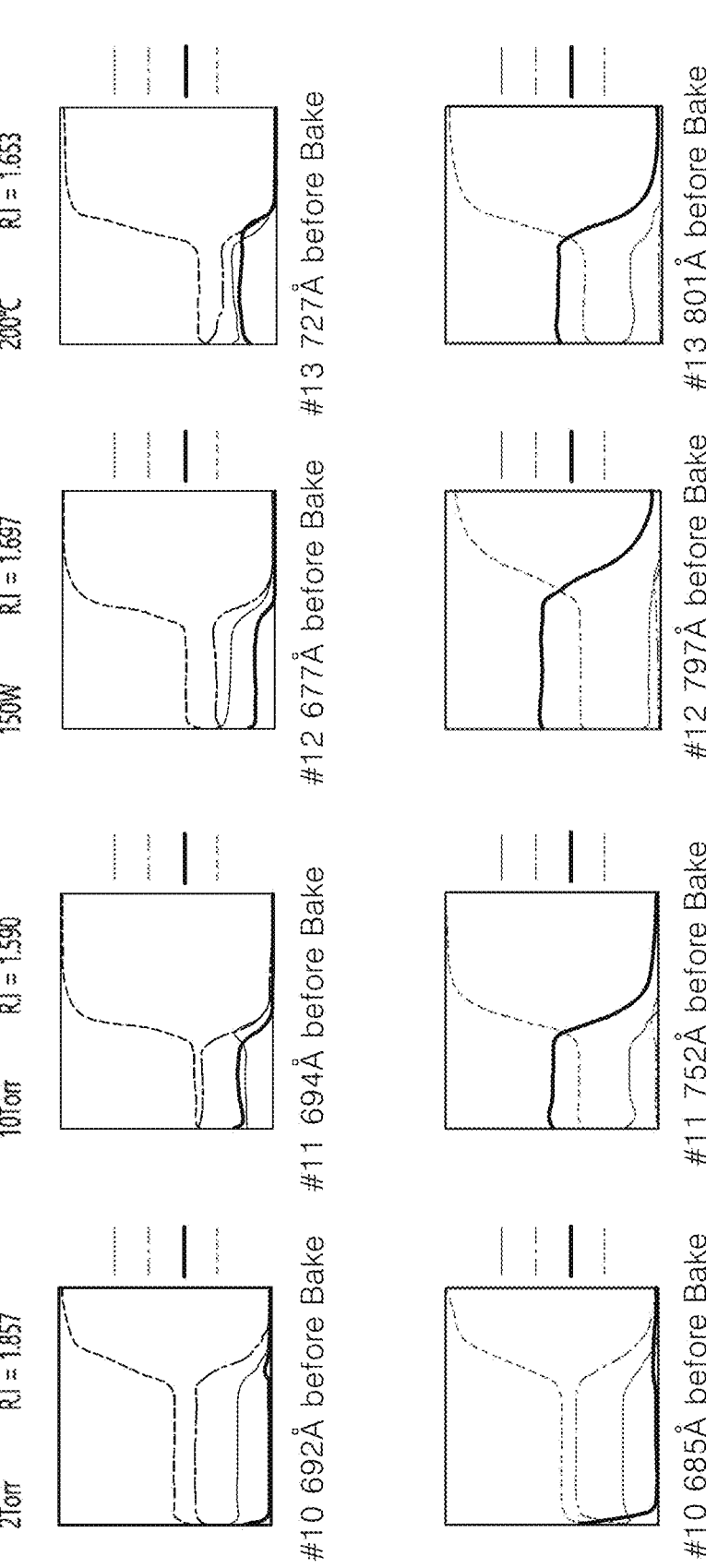

Referring next to FIG. 9, variations in refractive indexes according to changes in the process pressure of samples (SiCN thin films) #10 and #11 and the influences caused thereby are estimated.

In the case of the sample #10, only the process pressure is lower than that of the sample #2 seriously oxidized. As a result, it is checked that the sample #10 has the refractive index greater than or equal to 1.80 and keeps low oxygen content of 1.2% or under in the as-deposited state. Even after the application of the HAST conditions, that is, the sample #10 is not oxidized, still keeps low oxygen content, and is not increased in thickness.

In the case of the sample #11, only the process pressure is higher than that of the sample #1 having no oxidization. As a result, it is checked that the sample #11 has the refractive index less than 1.80 and high oxygen content of 16% in the as-deposited state. After the application of the HAST conditions, the sample #11 has explosively increasing oxygen content and is greatly increased in thickness.

In the case of the sample #12, only the RF power is lower than that of the sample #1 having no oxidization. As a result, it is checked that the sample #12 has the refractive index less than 1.80 and high oxygen content of 20% or above in the as-deposited state. After the application of the HAST conditions, the sample #12 has explosively increasing oxygen content and is greatly increased in thickness.

In the case of the sample #13, only the process temperature is lower than that of the sample #1 having no oxidization. As a result, it is checked that the sample #13 has the refractive index less than 1.80 and high oxygen content of 25% or above in the as-deposited state. After the application of the HAST conditions, the sample #13 has explosively increasing oxygen content and is greatly increased in thickness.

That is, the samples #11, #12, and #13 are different from one another in the reasons why their refractive indexes are lower than that of the sample #1, but if the refractive index is lowered irrespective of the reasons, it can be appreciated that the oxygen content in the as-deposited state is increased. In this case, if the SiCN thin films are exposed to a high humidity environment such as the application of the HAST conditions, the thin films themselves are oxidized and swollen to cause the oxygen content therein to be explosively increased, thereby making the thin film characteristics rapidly deteriorated.

Contrarily, in the case of the sample #10 having only the process pressure lower than that of the sample #2, it is checked that the sample #10 has the refractive index greater than or equal to 1.80 and very low oxygen content of 1.2% or under in the as-deposited state. Even after the application of the HAST conditions, that is, the sample #10 is not oxidized and keeps low oxygen content.

Figure 10:
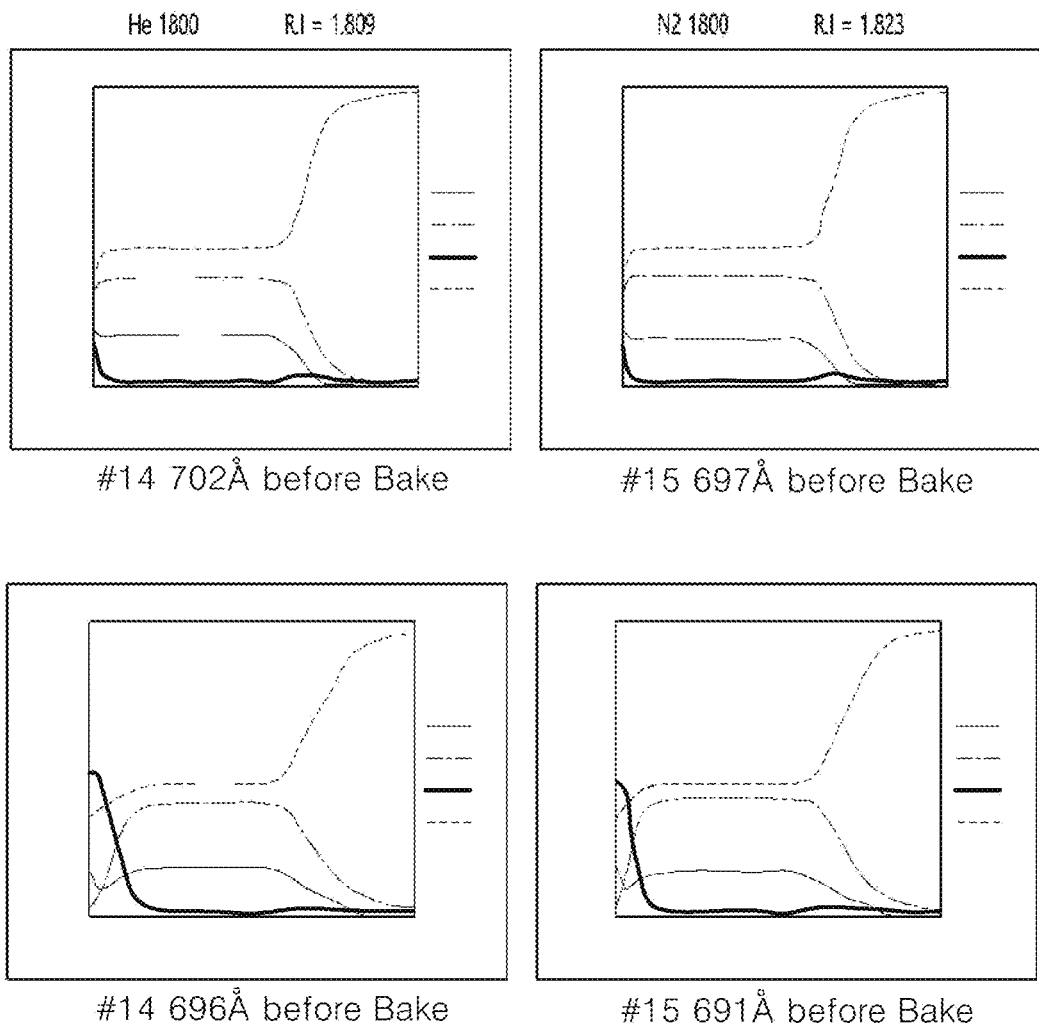

Referring next to FIG. 10, samples (SiCN thin films) #14 and #15 are controlled to have different reaction gas composition from that of the sample #1, while having the same total amount of gas for plasm excitation as the sample #1.

As a result, the samples #14 and #15 have the refractive indexes greater than or equal to 1.80, while keeping low oxygen content in the as-deposited states, like the sample #1.

Even after the application of the HAST conditions, further, it is observed that the samples #14 and #15 are just different in the degrees of oxygen diffusion around the surfaces, but they are not increased in oxygen content and thickness, like the sample #1.

Further, if there is a need to form a thin film having the refractive index less than 1.80, as suggested by the sample #3 of FIG. 6, the first SiCN thin film having the refractive index less than 1.80 and the second SiCN thin film having the refractive index greater than or equal to 1.80 are deposited sequentially.

In this case, the first SiCN thin film having the refractive index less than 1.80 is deposited to a desired thickness, and in an in-situ process, after that, the second SiCN thin film having the refractive index greater than or equal to 1.80 is additionally deposited, as a capping layer, onto the top of the first SiCN thin film. As a result, even if the first SiCN thin film having the refractive index less than 1.80 is weak in the introduction of oxygen, the introduction of oxygen in the atmosphere is blocked by means of the second SiCN thin film. In this case, even though the SiCN thin film is exposed to a high humidity environment, the characteristics of the SiCN thin film are prevented from being deteriorated.

Figure 11:
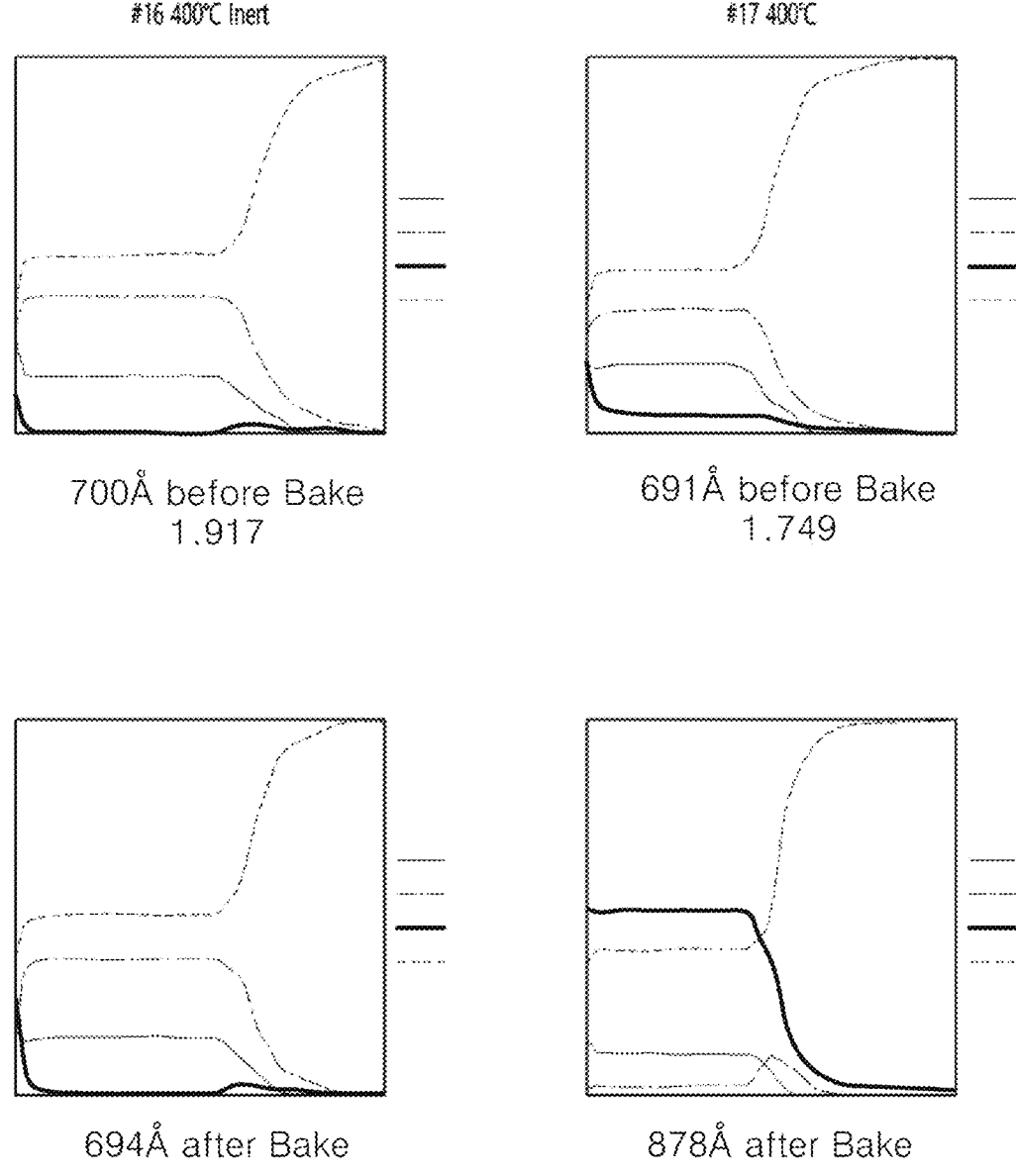

Referring next to FIG. 11, samples (SiCN thin films) #16 and #17 have only temperatures higher than that of the sample #1, without any process gas variations.

If a temperature is raised, the density of a thin film is increased and the refractive index thereof is also increased. As a result, it is checked that the sample #16 has the refractive index higher than that of the sample #1 and excellent oxidation resistance.

In the case of the sample #17, helium (He) and nitrogen (N2) are not put to allow the refractive index to be decreased on the condition of 400° C. As a result, the refractive index is lowered to 1.749, and if the sample #17 is exposed to the air, a portion thereof is immediately oxidized. After the application of the HAST conditions, oxygen content is increased to 50%.

Figure 12:
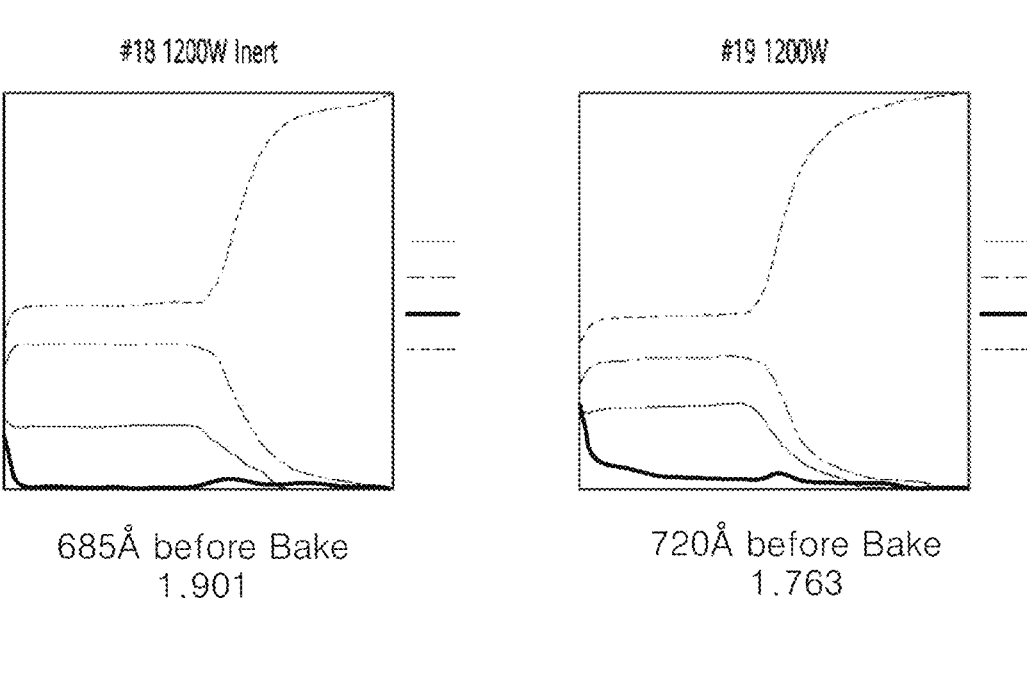
Figure 12:
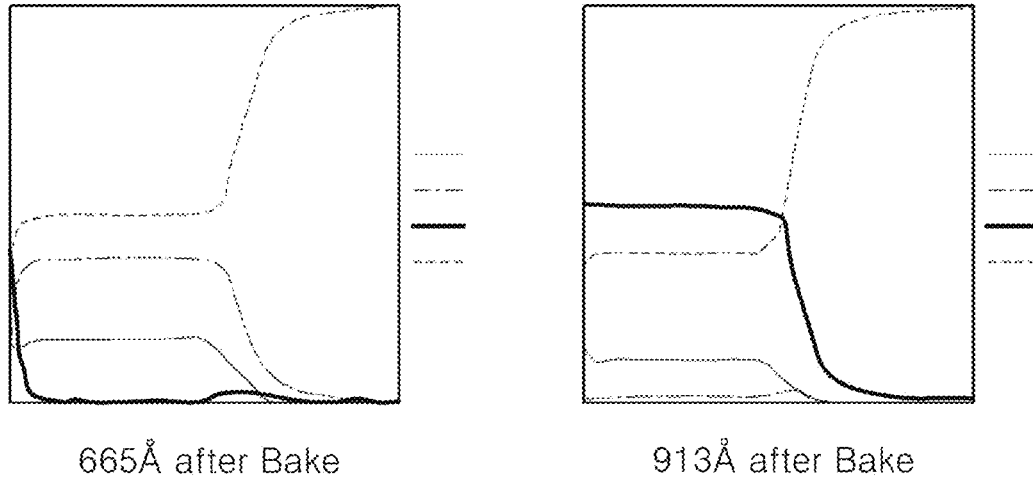

Referring next to FIG. 12, samples (SiCN thin films) #18 and #19 have only RF power higher than that of the sample #1, without any processing gas variations.

If RF power is raised, the density of a thin film is increased and the refractive index thereof is also increased. As a result, the sample #18 has the refractive index higher than that of the sample #1 and excellent oxidation resistance.

In the case of the sample #19, helium and nitrogen are not put to allow the refractive index to be decreased on the condition of RF power of 1200 W. As a result, the refractive index is lowered to 1.763, and if the sample #19 is exposed to the air, a portion thereof is immediately oxidized. After the application of the HAST conditions, oxygen content is increased to 50%.

Figure 13:
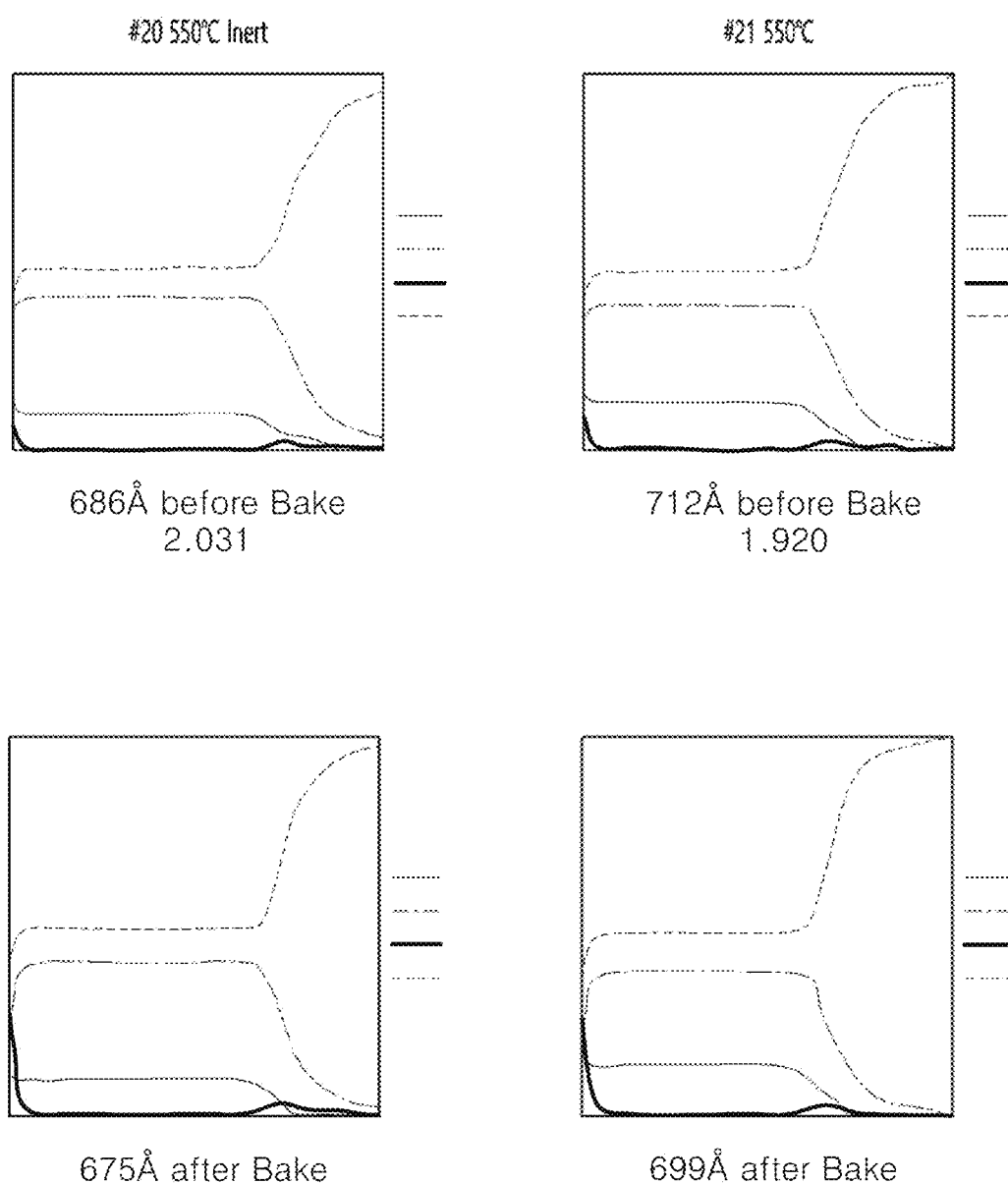

Referring next to FIG. 13, samples (SiCN thin films) #20 and #21 have temperatures increased to 550° C., which are higher than that of the sample #1, without any processing gas variations.

If a temperature is raised, the density of a thin film is increased and the refractive index thereof is also increased. As a result, the sample #20 has the refractive index higher than that of the sample #1 and excellent oxidation resistance.

In the case of the sample #21, helium and nitrogen are not put to allow the refractive index to be decreased on the condition of a temperature of 550° C. As a result, the refractive index of the sample #21 is lowered to 1.920, which is still high, and the sample #21 has high oxidation resistance.

According to the present invention, as described above, the SiCN thin film is formed under the film formation conditions wherein the refractive index of the SiCN thin film is greater than or equal to the specific refractive index, so that the deterioration of the thin film due to adsorption of moisture or oxygen, after the thin film has been formed, can be alleviated to improve the reliability of a device.

As mentioned above, the preferred embodiment of the present invention has been disclosed in the specification and drawings. In the description of the present invention, special terms are used not to limit the present invention and the scope of the present invention as defined in claims, but just to explain the present invention. Therefore, persons skilled in the relevant art can appreciate that many modifications and variations are possible in light of the above teachings. It is therefore intended that the scope of the invention be limited not by this detailed description, but rather by the claims appended hereto.

REFERENCE CHARACTERS

300: Chamber
302: Chuck heater
304: Target wafer

The invention claimed is:

1. A method for forming a SiCN thin film, the method comprising:

loading a target wafer onto a chuck heater located inside a chamber;

operating the chuck heater to allow the target wafer to be heated to a target deposition temperature in a range of 350° C.;

setting a target process pressure in the chamber to 2.0 to 4.2 Torr; and injecting a gas for plasma excitation and first and second reaction gases for forming the SiCN thin film into the chamber set to the target deposition temperature and the target process pressure to allow the SiCN thin film to have a refractive index in a range of 1.80 to 1.857, wherein the gas for plasma excitation comprises at least one or more gases selected from the group consisting of He, Ne, Ar, Xe, Kr, and $N_2$ and is injected into the chamber at a flow rate of 300 to 3000 sccm, the first reaction gas is either trimethylsilane (3MS) or tetraethylsilane (4MS), and the second reaction gas is $NH_3$, a distribution ratio of the first reaction gas to the second reaction gas in the chamber being set to 1:1.2 to 1:4, the flow rate of the gas for plasma excitation is inversely proportional to a flow rate of the second reaction gas, and the chamber has RF power set to 650 watt applied thereto.

2. A method for forming a SiCN thin film, the method comprising:

loading a target wafer onto a chuck heater located inside a chamber;

forming a first SiCN thin film having a first thickness in such a way that the first SiCN thin film has a refractive index of less than 1.80; and forming a second SiCN thin film having a second thickness on top of the first SiCN thin film in such a way that the second SiCN thin film has a refractive index in a range of 1.80 to 1.857, wherein a ratio of the first thickness to the second thickness is set to 1:1 to 1:2, wherein the forming of the second SiCN thin film includes:

operating the chuck heater to allow the target wafer with the first SiCN thin film formed thereon to be heated to a target deposition temperature of 350° C.;

setting a target process pressure in the chamber to 2.0 to 4.2 Torr; and injecting a gas for plasma excitation and first and second reaction gases for forming the second SiCN thin film into the chamber set to the target deposition temperature and the target process pressure to allow the second SiCN thin film to have a refractive index in a range of 1.80 to 1.857, and wherein the gas for plasma excitation comprises at least one or more gases selected from the group consisting of He, Ne, Ar, Xe, Kr, and $N_2$ and is injected into the chamber at the flow rate of 300 to 3000 sccm, the first reaction gas is either trimethylsilane (3MS) or tetraethylsilane (4MS), and the second reaction gas is $NH_3$, a distribution ratio of the first reaction gas to the second reaction gas in the chamber being set to 1:1.2 to 1:4, the flow rate of the gas for plasma excitation is inversely proportional to the flow rate of the second reaction gas, and the chamber has RF power set to 650 watt applied thereto.

* * * * *